US009277672B2

(12) United States Patent
Hata

(10) Patent No.: US 9,277,672 B2
(45) Date of Patent: Mar. 1, 2016

(54) TELEVISION, RADIATING MEMBER, AND ELECTRONIC APPARATUS

(71) Applicant: KABUSHIKI KAISHA TOSHIBA, Minato-ku, Tokyo (JP)

(72) Inventor: Yukihiko Hata, Hamura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 283 days.

(21) Appl. No.: 13/875,057

(22) Filed: May 1, 2013

(65) Prior Publication Data

US 2013/0235525 A1    Sep. 12, 2013

Related U.S. Application Data

(63) Continuation of application No. 13/157,872, filed on Jun. 10, 2011, now abandoned.

(30) Foreign Application Priority Data

Jun. 18, 2010  (JP) ................................. 2010-139797

(51) Int. Cl.
*H05K 7/20* (2006.01)
*G06F 1/20* (2006.01)

(52) U.S. Cl.
CPC ............ *H05K 7/20154* (2013.01); *G06F 1/203* (2013.01); *H05K 7/20963* (2013.01)

(58) Field of Classification Search
None
See application file for complete search history.

(56) References Cited

U.S. PATENT DOCUMENTS

| 6,407,921 | B1 | 6/2002 | Nakamura et al. | |
|---|---|---|---|---|
| 6,430,042 | B1 | 8/2002 | Ohashi et al. | |
| 6,681,840 | B1* | 1/2004 | Mok | 165/46 |
| 7,365,989 | B2 | 4/2008 | Peng et al. | |
| 7,755,902 | B2* | 7/2010 | Peng et al. | 361/719 |
| 7,817,425 | B2* | 10/2010 | Jeong | 361/704 |
| 7,885,067 | B2* | 2/2011 | Sakata | 361/695 |
| 7,986,520 | B2 | 7/2011 | Yamaguchi et al. | |
| 2004/0105233 | A1* | 6/2004 | Lai | 361/695 |
| 2004/0182552 | A1* | 9/2004 | Kubo | 165/104.33 |
| 2006/0144573 | A1 | 7/2006 | Nitta et al. | |
| 2009/0073655 | A1* | 3/2009 | Takakusaki et al. | 361/696 |
| 2009/0103262 | A1 | 4/2009 | Hata | |
| 2009/0129020 | A1* | 5/2009 | Fujiwara | 361/697 |
| 2009/0135563 | A1 | 5/2009 | Sakata | |
| 2009/0168331 | A1 | 7/2009 | Fujiwara | |

(Continued)

FOREIGN PATENT DOCUMENTS

| JP | 01-133338 A | 5/1989 |
|---|---|---|
| JP | 10-038484 A | 2/1998 |
| JP | 2000-214958 A | 8/2000 |

(Continued)

OTHER PUBLICATIONS

Japanese Office Action mailed Nov. 1, 2011 in corresponding Japanese Patent Application No. 2010-139797.

*Primary Examiner* — Courtney Smith
(74) *Attorney, Agent, or Firm* — Knobbe, Martens, Olson & Bear LLP

(57) ABSTRACT

According to one embodiment, an electronic apparatus includes a housing, a heat-generating component in the housing, a first radiating portion in the housing thermally connected to the heat-generating component, a second radiating portion in the housing thermally connected to the heat-generating component, and a fan configured to blow air to the first radiating portion and the second radiating portion.

9 Claims, 12 Drawing Sheets

(56) References Cited

U.S. PATENT DOCUMENTS

| | | | |
|---|---|---|---|
| 2010/0039772 A1* | 2/2010 | Nitta et al. | 361/697 |
| 2011/0310561 A1* | 12/2011 | Hata | 361/697 |

FOREIGN PATENT DOCUMENTS

| | | |
|---|---|---|
| JP | 2000-216575 A | 8/2000 |
| JP | 2004-039861 A | 2/2004 |
| JP | 2009-099740 A | 5/2009 |
| JP | 2009-169752 A | 7/2009 |
| JP | 2009-181421 A | 8/2009 |
| JP | 2010-061289 A | 3/2010 |
| JP | 2010-087044 A | 4/2010 |
| JP | 2010-091715 A | 4/2010 |
| WO | WO 2005/043620 A1 | 5/2005 |

* cited by examiner

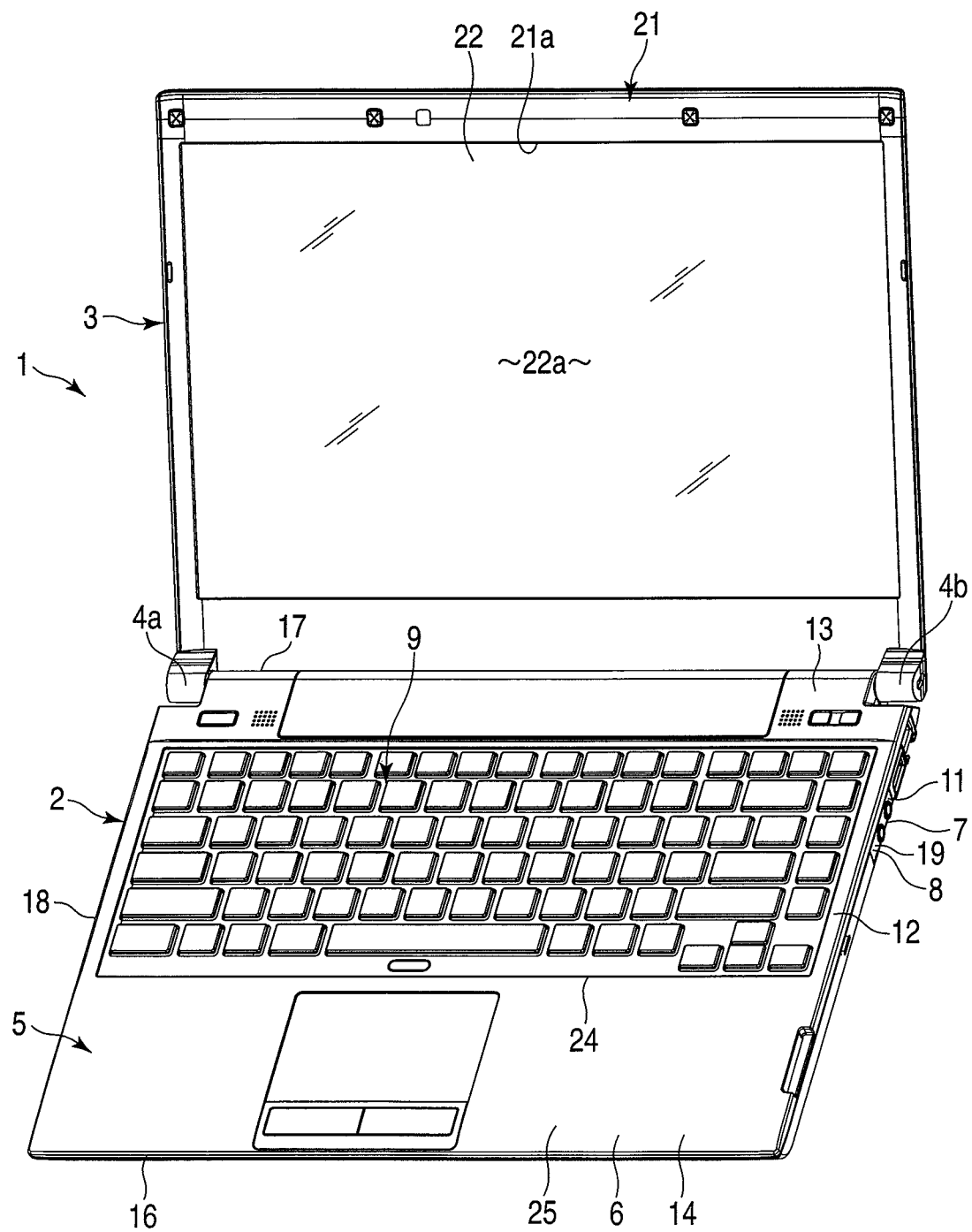
F I G. 1

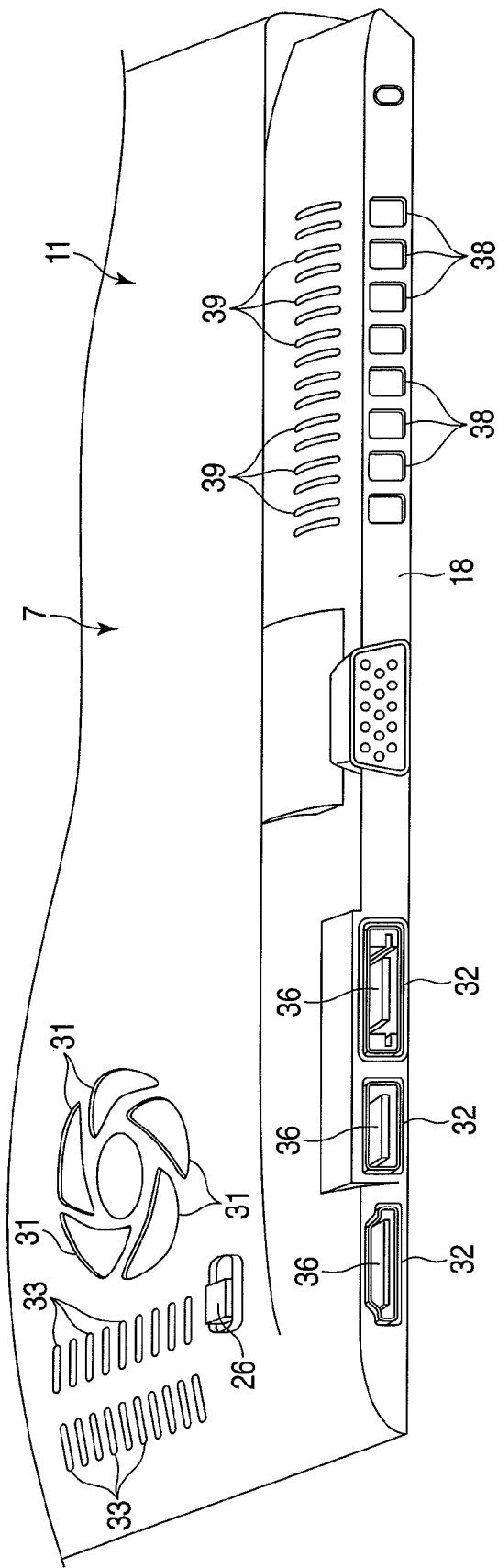
F I G. 3

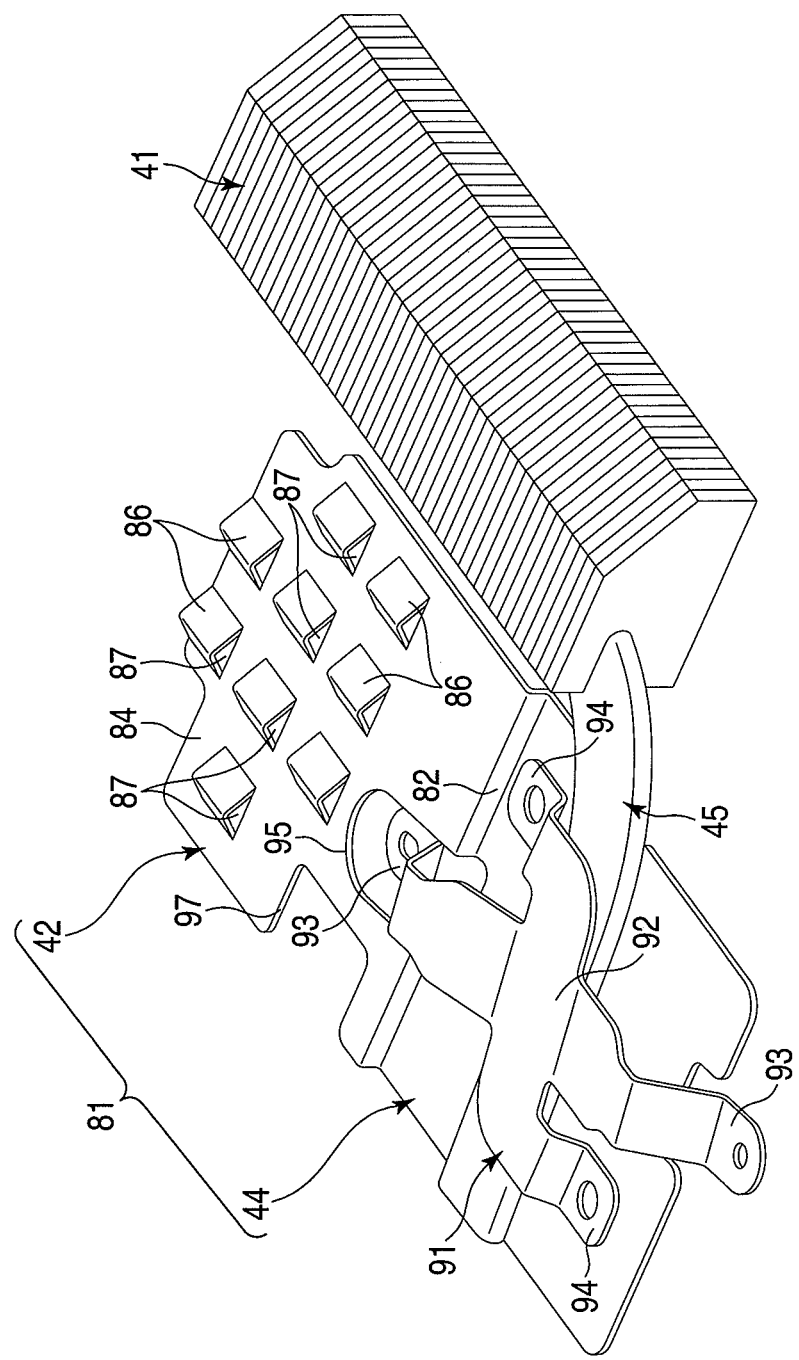
F I G. 6

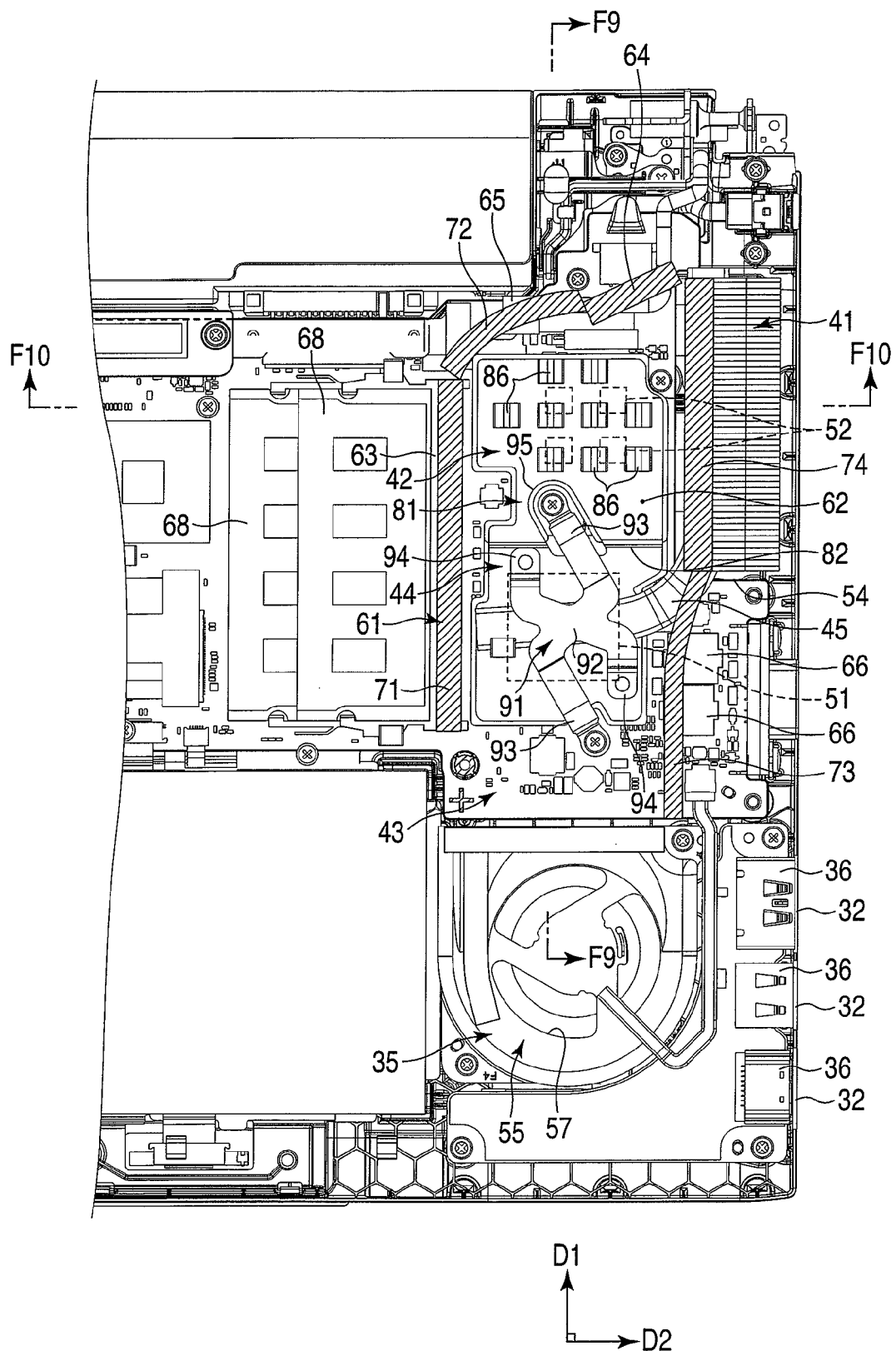
F I G. 8

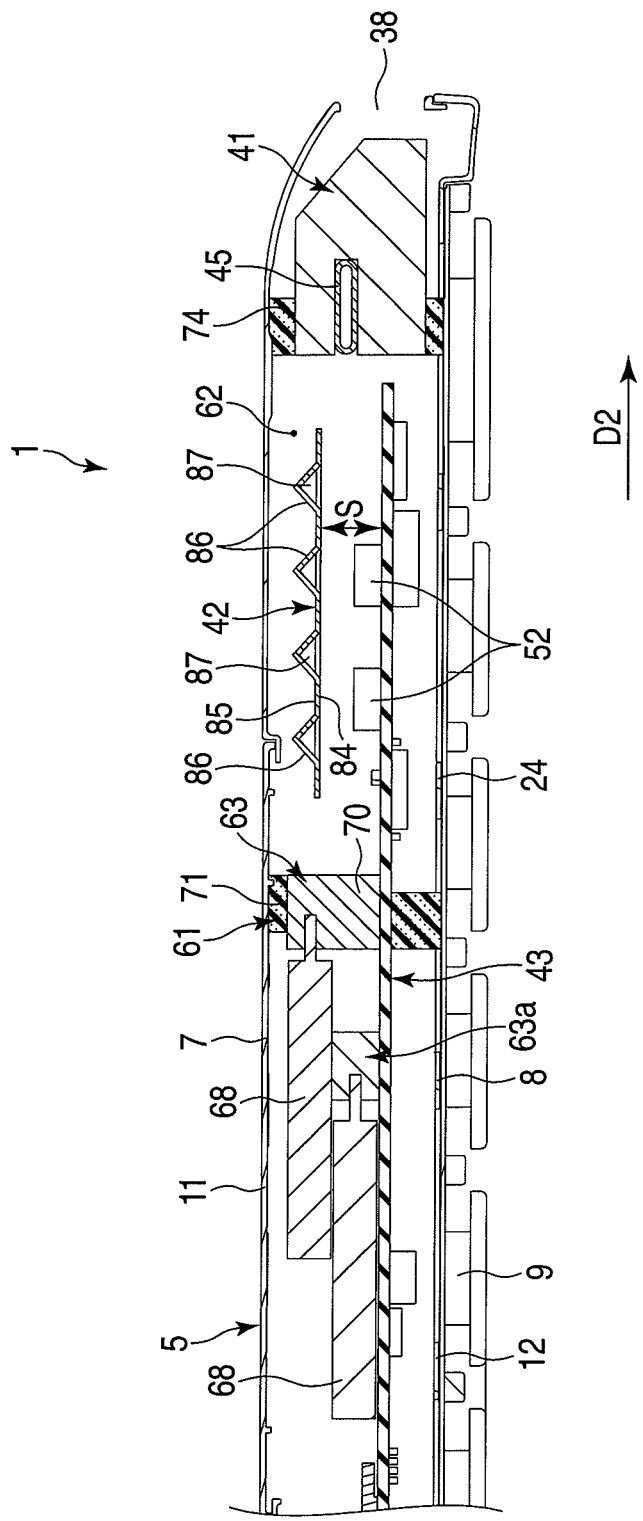
F I G. 10

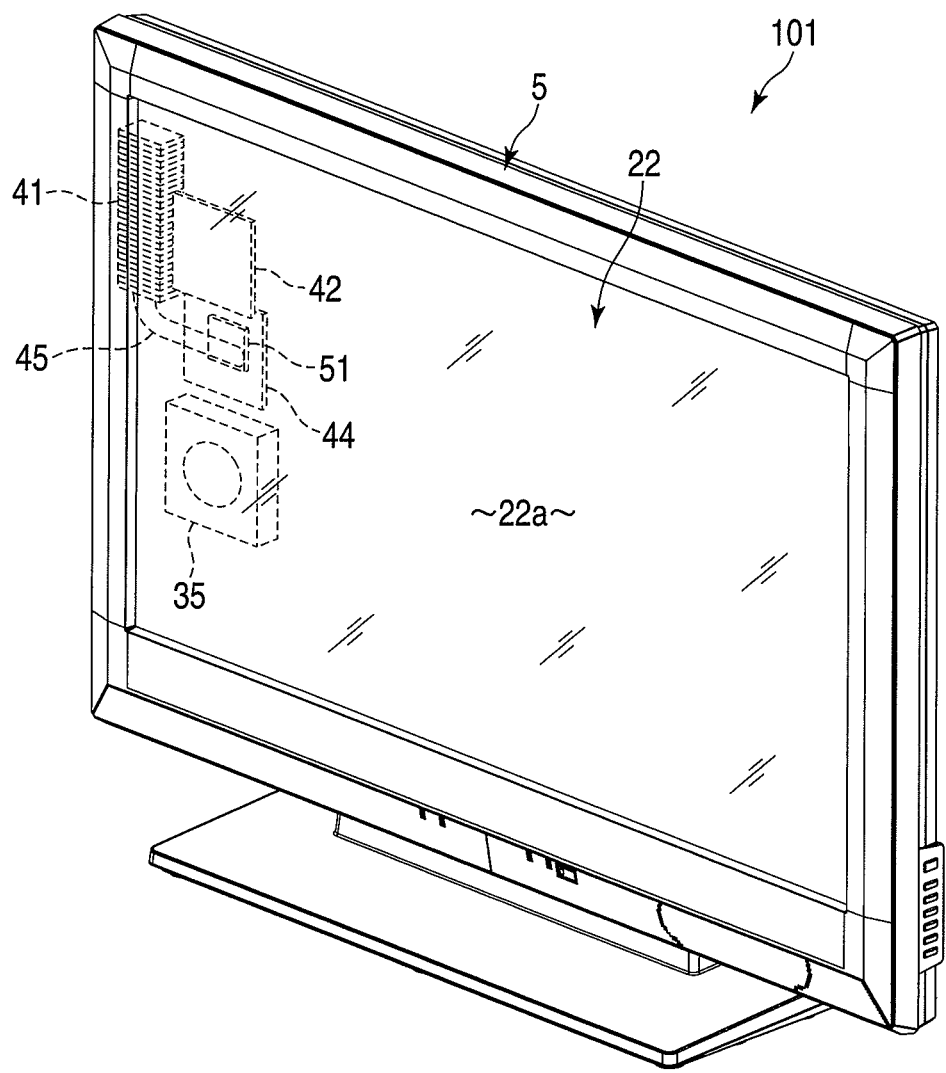
F I G. 11

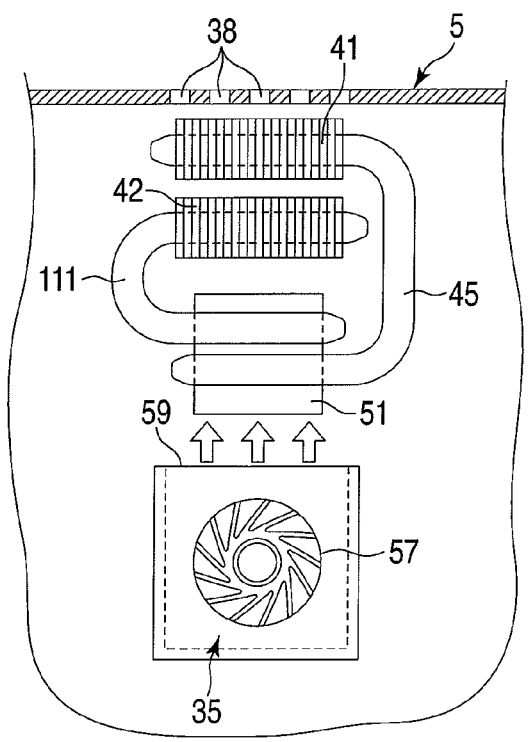
F I G. 12
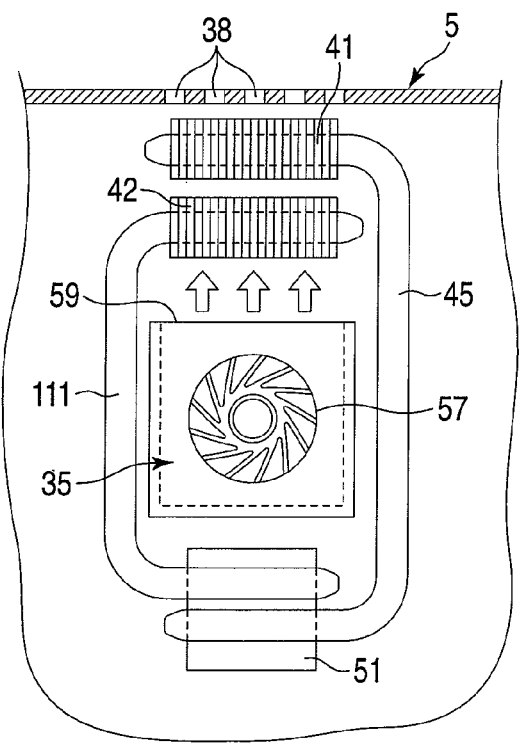
F I G. 13

TELEVISION, RADIATING MEMBER, AND ELECTRONIC APPARATUS

CROSS-REFERENCE TO RELATED APPLICATIONS

This application is a continuation of U.S. patent application Ser. No. 13/157,872 filed Jun. 10, 2011 which is based upon and claims the benefit of priority from Japanese Patent Application No. 2010-139797, filed Jun. 18, 2010, the entire contents of each of which are incorporated herein by reference.

FIELD

Embodiments described herein relate generally to a radiating member and radiation structures of a television and an electronic apparatus.

BACKGROUND

Some electronic apparatuses have a radiation structure including a heat sink, a heat pipe, and a fan.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 1 is an exemplary perspective view illustrating an example of an electronic apparatus according to a first embodiment;

FIG. 3 is an exemplary perspective view illustrating an example of a side surface of the electronic apparatus shown in FIG. 1;

FIG. 6 is an exemplary perspective view illustrating an example of a radiation structure shown in FIG. 4;

FIG. 8 is an exemplary plan view illustrating an example of the radiation structure shown in FIG. 4;

FIG. 10 is an exemplary cross-sectional view illustrating the radiation structure taken along the line F10-F10 of FIG. 8;

FIG. 11 is an exemplary perspective view illustrating an example of a television according to a second embodiment;

FIG. 12 is an exemplary cross-sectional view schematically illustrating an example of an electronic apparatus according to a third embodiment; and FIG. 13 is an exemplary cross-sectional view schematically illustrating an example of an electronic apparatus according to a fourth embodiment.

DETAILED DESCRIPTION

Figure 2:
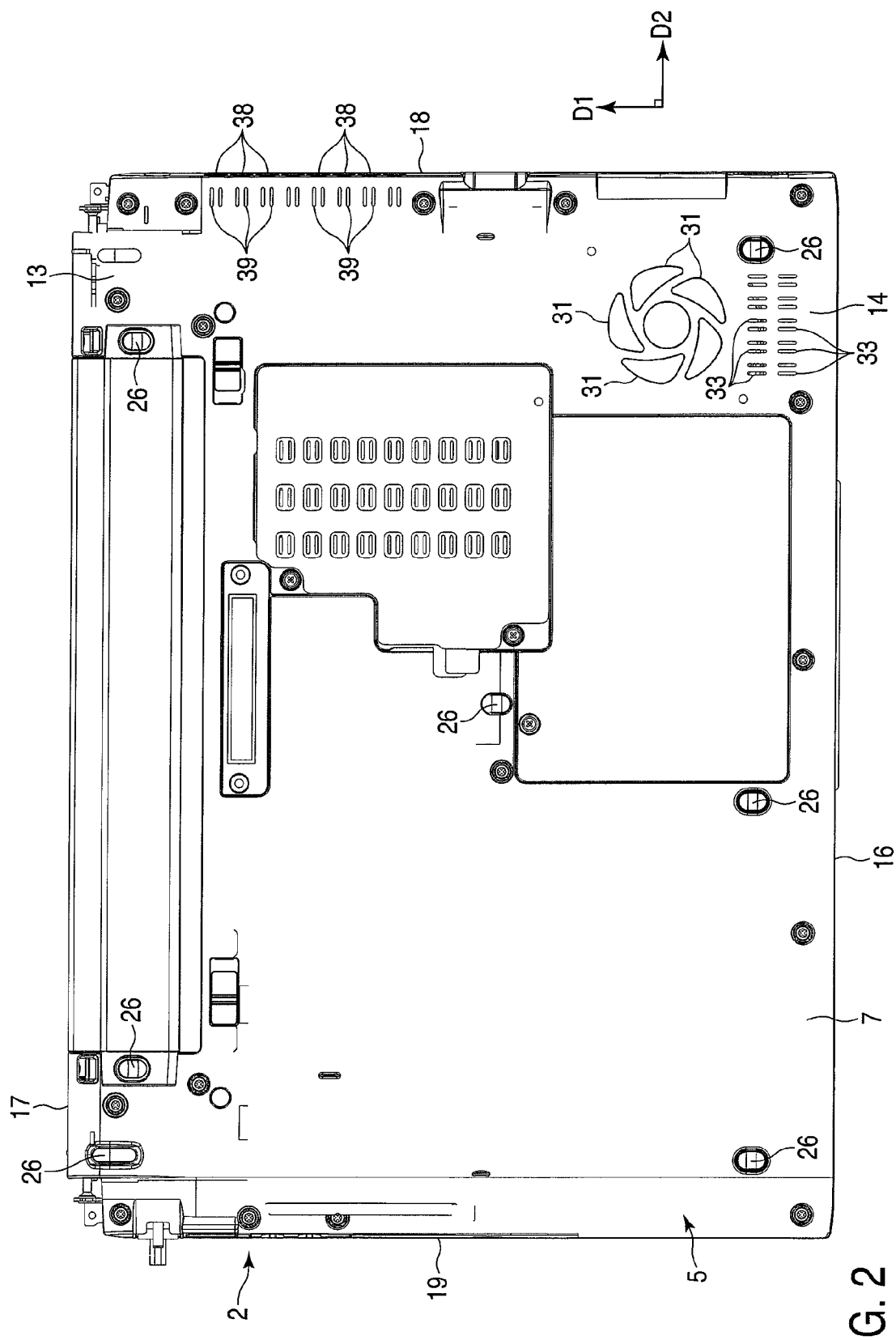
FIG. 2 is an exemplary plan view illustrating an example of a lower surface of the electronic apparatus shown in FIG. 1.
Figure 4:
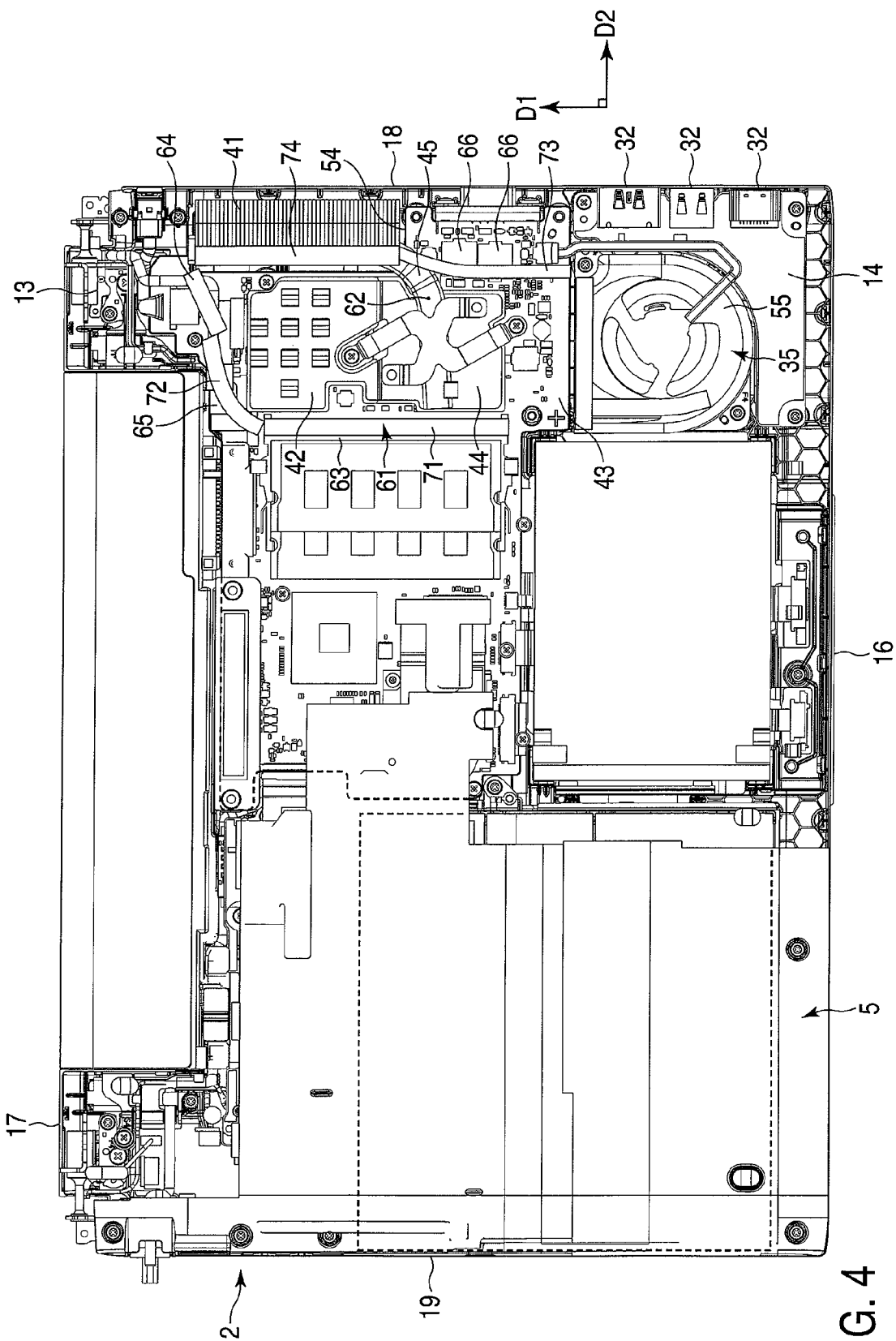
FIG. 4 is an exemplary plan view illustrating an example of an internal structure of the electronic apparatus shown in FIG. 1.
Figure 5:
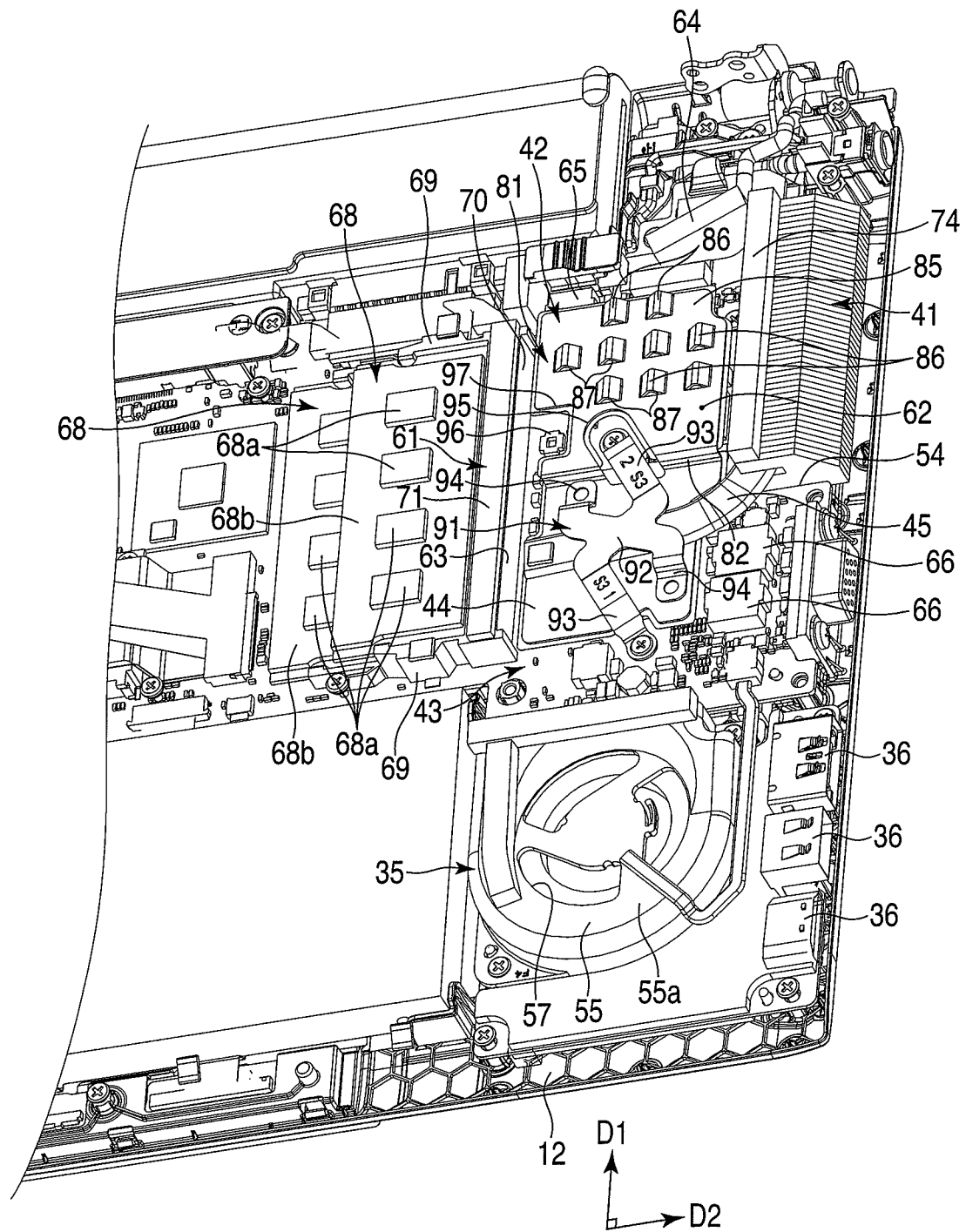
FIG. 5 is an exemplary perspective view illustrating an example of the internal structure of the electronic apparatus shown in FIG. 1.

Various embodiments will be described hereinafter with reference to the accompanying drawings.

In general, according to one embodiment, an electronic apparatus comprises a housing, a heat-generating component in the housing, a first radiating portion in the housing thermally connected to the heat-generating component, a second radiating portion in the housing thermally connected to the heat-generating component, and a fan configured to blow air to the first radiating portion and the second radiating portion.

Hereinafter, exemplary embodiments will be described with reference to the accompanying drawings.

(First Embodiment)

FIGS. 1 to 10 show an electronic apparatus 1 according to a first embodiment. The electronic apparatus 1 is, for example, a notebook personal computer. Electronic apparatuses to which the embodiment can be applied are not limited thereto. The embodiment can be widely applied to various kinds of electronic apparatuses, such as a television, a recording/reproducing apparatus, a PDA (Personal Digital Assistant), and a game machine.

As shown in FIG. 1, the electronic apparatus 1 includes a main unit 2, a display unit 3, and hinges 4a and 4b. The main unit 2 is an electronic apparatus main body provided with a main board. The main unit 2 includes a housing 5. The housing 5 has a flat box shape including an upper wall 6, a lower wall 7, and a circumferential wall 8.

The lower wall 7 faces a desk surface when the electronic apparatus 1 is placed on a desk. The lower wall 7 is substantially parallel to the desk surface. The upper wall 6 is opposite to the lower wall 7 with a space therebetween and extends substantially in parallel (that is, substantially in a horizontal direction) to the lower wall 7. A keyboard 9 is attached to the upper wall 6. The circumferential wall 8 rises with respect to the lower wall 7, and connects the edge portion of the lower wall 7 and the edge portion of the upper wall 6.

The housing 5 includes a base 11 and a cover 12. The base 11 includes the lower wall 7 and a part of the circumferential wall 8. The cover 12 includes the upper wall 6 and a part of the circumferential wall 8. The cover 12 is combined with the base 11 to form the housing 5.

The housing 5 includes a rear end portion 13 (first end portion) to which the display unit 3 is rotatably connected and a front end portion 14 (second end portion) provided opposite to the rear end portion 13. The circumferential wall 8 includes a front wall 16, a rear wall 17, a left wall 18, and a right wall 19. The front wall 16 extends in the width direction (left-right direction) of the housing 5 at the front end portion 14. The rear wall 17 extends in the width direction of the housing 5 at the rear end portion 13. The left wall 18 and the right wall 19 extend in the depth direction (front-rear direction) of the housing 5 and connect the end portions of the front wall 16 and the end portions of the rear wall 17.

The display unit 3 is rotatably (openably) connected to the rear end portion 13 of the main unit 2 by the hinges 4a and 4b. The display unit 3 can be pivoted between a closed position where the display unit 3 falls and covers the main unit 2 from the upper side and an opened position where the display unit 3 rises with respect to the main unit 2.

As shown in FIG. 1, the display unit 3 includes a display housing 21 and a display panel 22 in the display housing 21. A display screen 22a of the display panel 22 is exposed to the outside through an opening portion 21a in the front wall of the display housing 21.

Figure 9:
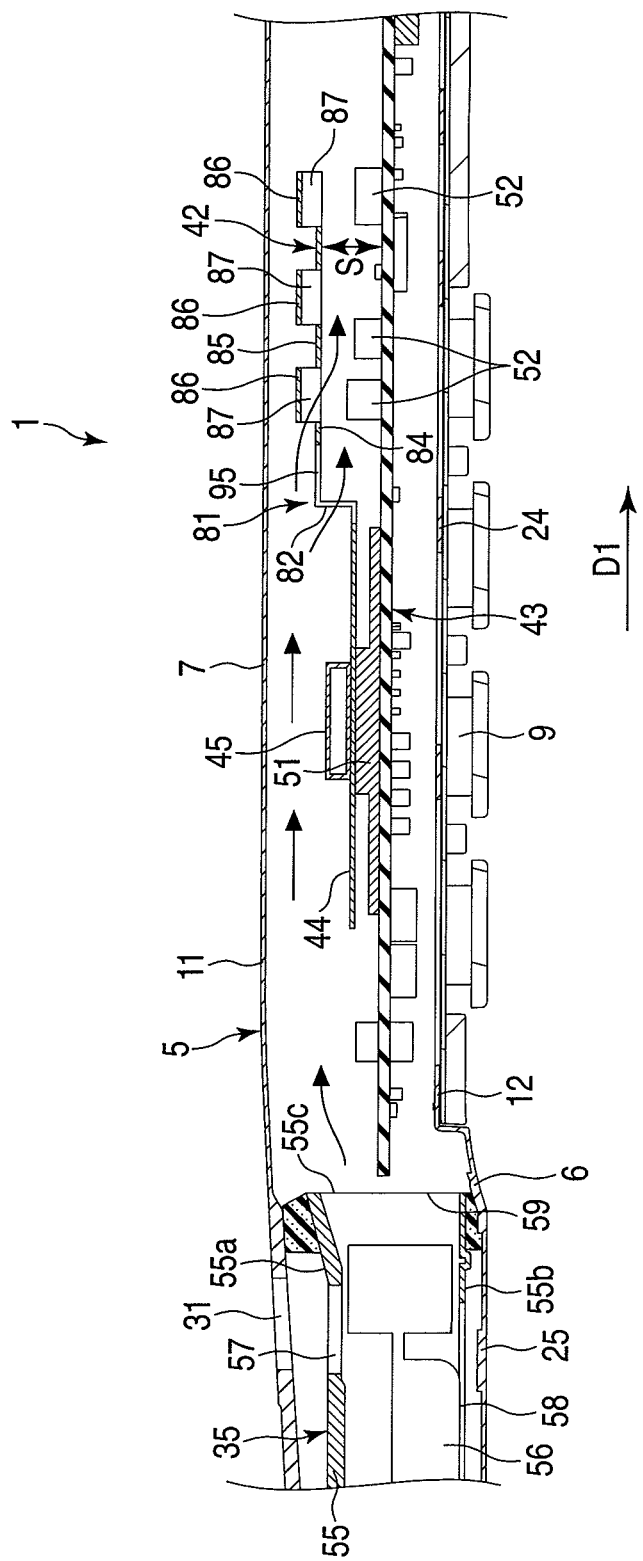
FIG. 9 is an exemplary cross-sectional view illustrating the radiation structure taken along the line F9-F9 of FIG. 8.

As shown in FIG. 1, the upper wall 6 includes a keyboard mounting portion 24 to which the keyboard 9 is attached and a palm rest 25. The palm rest 25 is in front of the keyboard mounting portion 24 in the depth direction, that is, between the keyboard mounting portion 24 and the front wall 16. As shown in FIG. 9, the keyboard mounting portion 24 is recessed from the palm rest 25 to the inside of the housing 5. In this way, the height of the upper surface of the keyboard 9 attached to the keyboard mounting portion 24 is substantially equal to or slightly greater than that of the upper surface of the palm rest 25.

As shown in FIG. 2, a plurality of leg portions 26 is provided on the lower wall 7 of the housing 5. The leg portions 26 come into contact with the upper surface of the desk and the lower wall 7 of the housing 5 is supported at a position separated from the upper surface of the desk. As shown in FIGS. 2 and 3, the housing 5 includes first inlets 31, second inlets 32, and third inlets 33. The first inlets 31, the second inlets 32, and the third inlets 33 are provided so as to be concentrated on, for example, the front left portion of the housing 5.

As shown in FIG. 2, the first inlets 31 and the third inlets 33 are provided in the lower wall 7. The first inlets 31 are below a fan 35, which will be described below, so as to face the fan 35. The third inlets 33 are not below the fan 35 and are provided between the first inlets 31 and the front wall 16.

As shown in FIG. 3, the second inlets 32 are provided in the left wall 18. The second inlets 32 are, for example, opening portions for exposing various kinds of connectors 36. The second inlets 32 enable fresh air to flow into the housing 5 through the gap between the connector 36 and the housing 5.

As shown in FIG. 3, the housing 5 includes first outlets 38 and second outlets 39. The first outlets 38 are provided in the left wall 18 at the rear end portion 13 of the housing 5, and extend, for example, in the side of the keyboard 9 and the rear end portion 13. The first outlets 38 face a first heat sink 41, which will be described below from the side thereof. The second outlets 39 are provided in the lower wall 7 at the rear end portion 13 of the housing 5 and face the first heat sink 41 from the lower side thereof.

Figure 7:
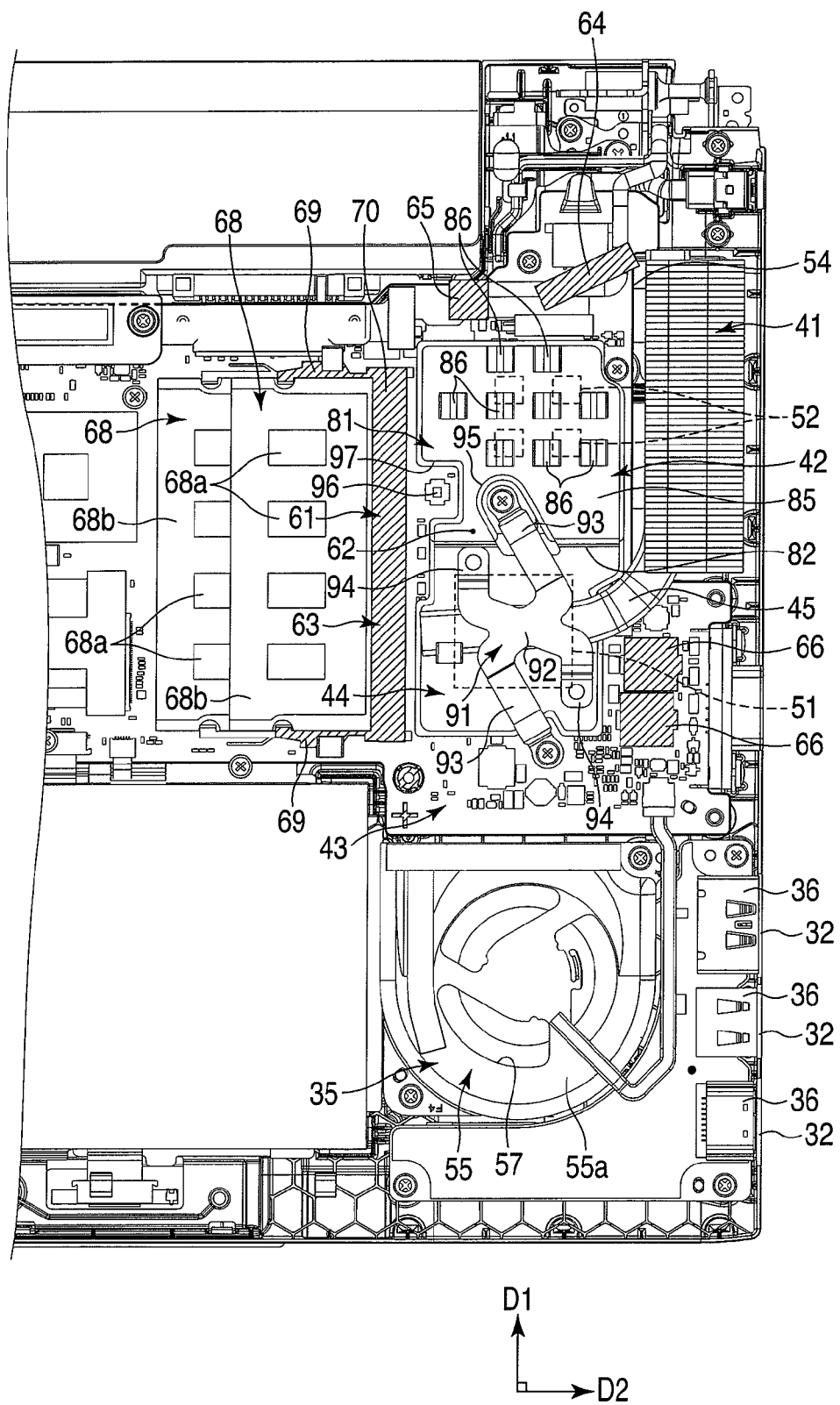
FIG. 7 is an exemplary plan view illustrating an example of the radiation structure shown in FIG. 4.

As shown in FIG. 7, the housing 5 includes a circuit board 43, a heat receiving portion 44, a heat pipe 45, the first heat sink 41, a second heat sink 42, and the fan 35(i.e., cooling fan). The circuit board 43 is, for example, the main board. As shown in FIG. 9, the circuit board 43 is provided below the keyboard mounting portion 24.

As shown in FIG. 7, the circuit board 43 includes a first heat-generating component 51 and a second heat-generating component 52. An example of the first heat-generating component 51 is a CPU (Central Processing Unit). The first heat-generating component 51 is a component that generates a relatively large amount of heat among the components of the circuit board 43. An example of the second heat-generating component 52 is a power supply circuit component. The amount of heat generated from the second heat-generating component 52 is less than the amount of heat generated from the first heat-generating component 51. The heat-generating components on the circuit board 43 are not limited thereto. The "heat-generating component" appropriately corresponds to various kinds of electronic components. The first heat-generating component 51 is closer to the fan 35 than the second heat-generating component 52.

A first direction D1 and a second direction D2 are defined as follows. As shown in FIG. 7, the first direction D1 is from the fan 35 to the first heat-generating component 51 and is a direction in which air is discharged from the fan 35. The second direction D2 is substantially orthogonal to the first direction D1 and is from the second heat sink 42 to the first heat sink 41.

In the specification, the vertical and horizontal directions are defined based on the normal position (the position shown in FIG. 1) of the electronic apparatus 1. Therefore, in the description using FIGS. 2, 4, 5, and 7 to 10 in which the electronic apparatus 1 is reversed, the upper, lower, right, and left expressions are contrary to the FIGS.

As shown in FIG. 7, the first heat sink 41 is provided at the rear end portion 13 of the housing 5 and faces the first outlets 38 of the housing 5. The first heat sink 41 is an example of a first radiating portion. The first heat sink 41 is, for example, a fin unit including a plurality of fins. The first heat sink 41 is below the keyboard mounting portion 24. In the first heat sink 41, the gap between the fins faces the first outlets 38. The heat sink 41 does not overlap the circuit board 43. The circuit board 43 includes a cut-out portion 54 provided so as to avoid the first heat sink 41.

As shown in FIG. 7, the heat receiving portion 44 is attached to the first heat-generating component 51. The heat receiving portion 44 has a plate shape and faces the first heat-generating component 51. The heat receiving portion 44 is thermally connected to the first heat-generating component 51 through, for example, heat transfer grease or a heat transfer sheet.

The heat pipe 45 is an example of a heat transfer member. The heat pipe 45 is attached to and thermally connected to the heat receiving portion 44. In this way, the heat pipe 45 is thermally connected to the first heat-generating component 51 through the heat receiving portion 44. The heat pipe 45 extends from the first heat-generating component 51 to the first heat sink 41.

The heat pipe 45 thermally connects the first heat-generating component 51 to the first heat sink 41 such that heat generated from the first heat-generating component 51 is transferred to the first heat sink 41. The first heat sink 41 is arranged so as to deviate from the first heat-generating component 51 to the rear side of the housing 5. In this way, it is possible to relatively reduce the total length of the heat pipe 45.

As shown in FIG. 7, the fan 35 is provided at the front end portion 14 of the housing 5 so as to be away from the first heat sink 41. The fan 35 is disposed so as to face the first heat sink 41 and the second heat sink 42 with the first heat-generating component 51 interposed therebetween.

As shown in FIG. 9, the fan 35 is below the palm rest 25. That is, the fan 35 is not below the keyboard mounting portion 24 where the thickness of the housing 5 is relatively small, and is below the palm rest 25 where the thickness of the housing 5 is relatively large.

The fan 35 is a centrifugal fan and includes a fan case 55 and an impeller 56 rotated in the fan case 55. The fan case 55 includes first intakes 57, second intakes 58, and a discharge hole 59.

As shown in FIG. 9, the fan case 55 includes a lower surface 55a facing the lower wall 7, an upper surface 55b opposite to the lower surface 55a and facing the upper wall 6, and a circumferential surface 55c facing the circuit board 43. The first intakes 57 are provided in the lower surface 55a of the fan case 55 and face the first inlets 31 of the lower wall 7. The second intakes 58 are provided in the upper surface 55b of the fan case 55 and face the palm rest 25.

The discharge hole 59 is provided in the circumferential surface 55c. The discharge hole 59 is opened in the first direction D1 and faces the first heat-generating component 51. The fan 35 draws air in the housing 5 through the first intakes 57 and the second intakes 58 and discharges the air from the discharge hole 59 to the first heat-generating component 51. The fan 35 blows air to the first heat sink 41 and the second heat sink 42, which will be described below.

As shown in FIG. 8, the electronic apparatus 1 includes a wind shielding portion 61 that partitions a portion of the inner space of the housing 5. A wind guide path 62 (air flow path)

that guides air from the fan 35 to the first heat sink 41 through the first heat-generating component 51 is formed by the wind shielding portion 61.

The wind shielding portion 61 is formed by, for example, electronic components 63, 64, 65, and 66 on the circuit board 43 and some sealing members 71, 72, 73, and 74. In FIG. 7, the sealing members 71, 72, 73, and 74 are removed. In FIGS. 7 and 8, for convenience of description, the components forming the wind shielding portion 61 are hatched. In addition, the wind shielding portion 61 may be formed by ribs provided as a portion of the housing 5 or other pieces made of a synthetic resin.

As shown in FIG. 7, a memory slot connector 63, an LCD connector 64, a first power coil 65, and a second power coil 66 are mounted on the circuit board 43. The memory slot connector 63 is an example of a board component and an example of a long connector. The term "long connector" means a connector with a side longer than one side of the chip of the first heat-generating component 51 (first heat-generating component) in the longitudinal direction. The "long connector" is not limited to the memory slot connector 63, but may be, for example, a docking connector or a connector for a television tuner.

As shown in FIG. 7, the longitudinal direction of the memory slot connector 63 is aligned with the discharge direction (first direction D1) of the fan 35. A memory 68 is connected to the memory slot connector 63. The memory 68 includes a memory board 68b provided with a plurality of memory chips 68a. The memory slot connector 63 is adjacent to the first heat-generating component 51, with the memory 68 facing the opposite side of the first heat-generating component 51.

The memory slot connector 63 includes a pair of holders 69 that holds the memory 68 so as to make a gap between the memory 68 and the circuit board 43, and a terminal portion 70 fixed to the circuit board 43. The terminal portion 70 closely adheres to the circuit board 43 such that there is no gap between the terminal portion 70 and the circuit board 43.

As shown in FIG. 10, the memory slot connector 63 is a second connector of a so-called two-stage memory accommodating portion. That is, another memory slot connector 63a is between the memory 68 attached to the memory slot connector 63 and the circuit board 43. In other words, the terminal portion 70 of the memory slot connector 63 is relatively tall.

As shown in FIG. 7, the memory slot connector 63 is arranged such that the terminal portion 70 is closer to the first heat-generating component 51 than the holders 69. A part of the memory slot connector 63 faces the first heat-generating component 51. The memory slot connector 63 is in parallel to the first heat-generating component 51. The memory slot connector 63 extends from the side of the first heat-generating component 51 to the side of the second heat-generating component 52. The memory slot connector 63 faces a part of the first heat sink 41 and the second power coil 66 in the second direction D2.

As shown in FIG. 7, the first power coil 65 and the LCD connector 64 are between the end portion of the memory slot connector 63 and the end portion of the first heat sink 41. Each of the first power coil 65 and the LCD connector 64 is an example of the board component. The first power coil 65 and the LCD connector 64 are arranged in the second direction D2.

The first power coil 65 and the LCD connector 64 face the discharge hole 59 of the fan 35 in the first direction D1. That is, air discharged from the discharge hole 59 of the fan 35 passes through the first heat-generating component 51 and the second heat-generating component 52, collides with the first power coil 65 and the LCD connector 64, and flows to the first heat sink 41.

The second power coil 66 is opposite to the memory slot connector 63 with the first heat-generating component 51 interposed therebetween. The gap between the second power coil 66 and the memory slot connector 63 is substantially equal to the width of the discharge hole 59 of the fan 35.

The memory slot connector 63, the first power coil 65, the LCD connector 64, and the second power coil 66 form the wind guide path 62 with a substantially L shape through which cooling air flows from the fan 35 to the first heat sink 47, in cooperation with the lower wall 7 of the housing 5 and the left wall 18 of the housing 5.

That is, each of the memory slot connector 63, the first power coil 65, the LCD connector 64, and the second power coil 66 forms at least a portion of the wall of the wind guide path 62. In other words, each of the memory slot connector 63, the first power coil 65, the LCD connector 64, and the second power coil 66 serves as a wall that guides cooling air from the fan 35 to the first heat sink 47.

Each of the sealing members 71, 72, 73, and 74 is an example of an elastic member and is also an example of a non-conductive member. Each of the sealing members 71, 72, 73, and 74 is an insulating body, such as sponge, rubber, or an insulator.

As shown in FIGS. 8 and 10, the first sealing member 71 is between the terminal portion 70 of the memory slot connector 63 and the inner surface of the housing 5. The first sealing member 71 extends in the first direction D1. The first sealing member 71 has substantially the same length as the terminal portion 70 of the memory slot connector 63. The first sealing member 71 is compressed in the gap between the memory slot connector 63 and the inner surface of the housing 5, thereby air-tightly sealing the gap.

The second sealing member 72 is between the first power coil 65 and the inner surface of the housing 5. For example, the second sealing member 72 extends from the end portion of the memory slot connector 63 to the end portion of the LCD connector 64. The second sealing member 72 is compressed in the gap between the first power coil 65 and the inner surface of the housing 5, thereby air-tightly sealing the gap. For example, the second sealing member 72 may extend to the end portion of the first heat sink 41. Alternatively, the second sealing member 72 may extend between the LCD connector 64 and the inner surface of the housing 5.

As shown in FIG. 8, the third sealing member 73 is between the second power coil 66 and the inner surface of the housing 5. For example, the third sealing member 73 extends from the end portion of the fan 35 to the end portion of the first heat sink 41. The third sealing member 73 is compressed in the gap between the second power coil 66 and the inner surface of the housing 5, thereby air-tightly sealing the gap. In addition, for example, the third sealing member 73 may be only in a portion of the space between the fan 35 and the first heat sink 41.

As shown in FIGS. 8 and 10, the fourth sealing member 74 is between the first heat sink 41 and the inner surface of the housing 5. The fourth sealing member 74 extends over the entire length of the first heat sink 41 in the longitudinal direction (first direction D1). The fourth sealing member 74 is compressed in the gap between the first heat sink 41 and the inner surface of the housing 5, thereby air-tightly sealing the gap.

In this way, cooling air reaching the first heat sink 41 is exhausted to the outside through the gap between the fins of the first heat sink 41 without passing through the gap between the first heat sink 41 and the inner surface of the housing 5. According to the above-mentioned structure, air discharged from the fan 35 passes through the first heat-generating component 51 and flows to the first heat sink 41. That is, the air discharged from the fan 35 flows through a substantially L-shaped flow path.

As shown in FIG. 8, the second heat sink 42 is in the wind guide path 62. The second heat sink 42 is an example of a second radiating portion. The second heat sink 42 is between the first heat-generating component 51 and the first heat sink 41 in the flow path of the air from the fan 35. That is, the first heat-generating component 51 is between the fan 35 and the second heat sink 42.

The second heat sink 42 is formed by a flat metal plate. The second heat sink 42 is arranged so as to overlap the circuit board 43 and is substantially parallel to the circuit board 43. That is, the second heat sink 42 is in the region of the circuit board 43.

As shown in FIG. 6, the second heat sink 42 is connected to the heat receiving portion 44. The second heat sink 42 and the heat receiving portion 44 are integrally formed of, for example, a metal plate. The second heat sink 42 is thermally connected to the first heat-generating component 51 through the heat receiving portion 44. That is, a radiating member 81 including the heat receiving portion 44 and the radiating portion (second heat sink 42) integrally formed with each other is attached to the first heat-generating component 51.

As shown in FIG. 9, the second heat sink 42 extends from the heat receiving portion 44 to the rear side (the downstream side of cooling air). The second heat sink 42 covers the second heat-generating component 52. The second heat sink 42 has a substantially rectangular shape and is substantially parallel to the memory slot connector 63 and the first heat sink 41. The second heat sink 42 faces the first heat sink 41 in the second direction D2. The second heat sink 42 is between a portion of the memory slot connector 63 and the first heat sink 41.

As shown in FIG. 9, a step portion 82 is provided between the second heat sink 42 and the heat receiving portion 44, and the second heat sink 42 is further away from the circuit board 43 than the heat receiving portion 44. In this way, a space S through which air flows is formed between the second heat sink 42 and the circuit board 43.

The height of the step portion 82 between the second heat sink 42 and the heat receiving portion 44 is more than the thickness of the heat pipe 45. In this way, the second heat sink 42 is further away from the circuit board 43 than the heat pipe 45. Therefore, air from the fan 35 is more likely to reach the second heat sink 42 without being hindered by the heat pipe 45. In FIG. 9, for convenience of description, a pressing member 91 is omitted.

As shown in FIG. 9, the second heat sink 42 includes a first surface 84 and a second surface 85. The first surface 84 faces the circuit board 43. The second surface 85 is opposite to the first surface 84 and faces the inner surface of the housing 5. A plurality of projections 86 is provided on the second surface 85. The projections 86 are arranged in parallel to the direction (first direction D1) in which the fan 35 blows air and a direction (second direction D2) substantially orthogonal to the first direction D1.

As shown in FIG. 6, the projections 86 are formed by bending a portion of the plate-shaped second heat sink 42 by, for example, pressing so as to protrude. The projection 86 is formed in a mountain shape and extends in the direction in which the fan 35 blows air. Therefore, the projection 86 includes a through hole 87 which extends in the direction in which the fan 35 blows air and through which the air flows. The through hole 87 passes through the projection 86 in the direction in which the fan 35 blows air.

The through hole 87 also passes through the second heat sink 42 from the first surface 84 to the second surface 85 and faces the circuit board 43. The through hole 87 is provided in the region in which the projection 86 is formed by forming the projection 86 so as to protrude in a mountain shape. Air from the fan 35 can flow into the space S between the second heat sink 42 and the circuit board 43 through the through holes 87.

As shown in FIG. 8, the projection 86 is not provided at the end portion (corner portion) of the second heat sink 42 that is opposite to the first heat-generating component 51 and is close to the first heat sink 41, and the end portion of the second heat sink 42 is flat. Therefore, air passing through the second heat sink 42 can smoothly flow toward the first heat sink 41.

As shown in FIG. 7, the pressing member 91 is attached to the heat receiving portion 44. The pressing member 91 includes a pressing portion 92 facing the heat pipe 45, fixing portions 93 (first fixing portion) fixed to the circuit board 43, and fixing portions 94 (second fixing portion) fixed to the heat receiving portion 44. The pressing member 91 functions as a leaf spring and presses the heat receiving portion 44 against the first heat-generating component 51. In this way, the thermal conductivity between the heat receiving portion 44 and the first heat-generating component 51 is improved.

The fixing portions 93 of the pressing member 91 extend over the heat receiving portion 44 in the first direction D1. The second heat sink 42 includes a cut-out portion 95 which is formed in the second heat sink 42 from the first surface 84 to the second surface 85 and into which one of the fixing portions 93 of the pressing member 91 is inserted. The fixing portion 93 of the pressing member 91 is attached to the circuit board 43 through the cut-out portion 95. The cut-out portion 95 is formed across the second heat sink 42, the step portion 82, and the heat receiving portion 44. The cut-out portion 95 is provided at the upstream end portion of the second heat sink 42 and faces the discharge hole 59 of the fan 35.

Air passing through the heat receiving portion 44 can flow from the cut-out portion 95 into the space S between the second heat sink 42 and the circuit board 43. The cut-out portion is formed by cutting out an end portion of a component, but the embodiment is not limited thereto. For example, the "cut-out portion" also includes an opening portion (through hole) at the center of a component, as shown in FIG. 6. As shown in FIG. 8, the second heat sink 42 includes another cut-out portion 97 provided so as to avoid a connector 96.

Next, the operation of the electronic apparatus 1 will be described.

When the electronic apparatus 1 is used, heat is generated from the first heat-generating component 51 and the second heat-generating component 52. A part of the heat generated from the first heat-generating component 51 is transferred to the first heat sink 41 through the heat receiving portion 44 and the heat pipe 45. In addition, another part of the heat generated from the first heat-generating component 51 is transferred to the second heat sink 42 through the heat receiving portion 44.

The fan 35 draws fresh air from the outside of the housing 5 through the first inlets 31, the second inlets 32, and the third inlets 33 of the housing 5. The fan 35 discharges the drawn relatively cold air (air that is not warm) to the first heat-generating component 51.

The air discharged to the first heat-generating component 51 takes heat from the first heat-generating component 51 while flowing around the first heat-generating component 51. The air passing through the first heat-generating component 51 flows to the second heat sink 42. Then, the air takes heat from the second heat sink 42 while passing around the second heat sink 42.

In this case, a part of the air flowing to the second heat sink 42 flows from the through holes 87 or the cut-out portion 95 of the second heat sink 42 to the space S between the second heat sink 42 and the circuit board 43. The air flowing to the space S takes heat from the second heat-generating component 52 while passing around the second heat-generating component 52.

The air passing through the second heat sink 42 flows to the first heat sink 41 by the wind guide path 62. The air takes heat from the first heat sink 41 while passing through the first heat sink 41. The air passing through the first heat sink 41 is discharged to the outside of the housing 5 through the first outlets 38 and the second outlets 39.

According to this structure, it is possible to improve heat radiation efficiency. That is, when two heat sinks 41 and 42 are thermally connected to one heat-generating component 51, a plurality of heat radiation paths is formed with respect to one heat-generating component 51. Therefore, it is possible to effectively cool the heat-generating component 51.

That is, it is possible to radiate heat from the heat-generating component 51 using the first heat sink 41 and the additional second heat sink 42. Therefore, it is possible to achieve high heat radiation efficiency. When the two heat sinks 41 and 42 are cooled by air blown from the fan 35, it is not necessary to increase the number of fans, and thus it is possible to reduce the size and cost of an electronic apparatus.

In this embodiment, the first heat-generating component 51 is between the second heat sink 42 and the fan 35 in the flow path of the air from the fan 35. That is, the first heat-generating component 51 is provided on the upstream side of the first heat sink 41 and the second heat sink 42 in the flow path of the air from the fan 35.

According to this structure, relatively cold air not heated by the first heat sink 41 or the second heat sink 42 is preferentially supplied to the first heat-generating component 51 that may need to be cooled first. According to this structure, it is possible to accelerate the cooling of the first heat-generating component 51, as compared to the structure in which air passing through the second heat sink 42 is supplied to the first heat-generating component 51. Therefore, it is possible to improve the overall heat radiation efficiency of the electronic apparatus 1.

In this embodiment, the first heat sink 41 is thermally connected to the first heat-generating component 51 by the heat pipe 45 and faces the outlets 38 of the housing 5. The second heat sink 42 is between the first heat-generating component 51 and the first heat sink 41. That is, the second heat sink 42 is in the space between the first heat sink 41 adjacent to the outlets 38 and the first heat-generating component 51. Therefore, it is possible to effectively use the space. The use of the arrangement structure makes it possible to reduce the size of the electronic apparatus 1 even when the second heat sink 42 is provided.

In this embodiment, the first heat sink 41 is a fin unit and the second heat sink 42 has a plate shape. The plate-shaped second heat sink 42 can be arranged so as to overlap other units or components. Therefore, it is possible to reduce the size of the electronic apparatus 1 even when the second heat sink 42 is provided. When the second heat sink 42 is arranged so as to overlap the circuit board 43, it is possible to arrange the second heat sink 42 without limiting the size of the circuit board 43.

Flexibility in the shape of the second heat sink 42 is higher than that in the shape of the fin unit and the second heat sink 42 may include a cut-out portion. For example, the second heat sink 42 includes the cut-out portion 97 provided so as to avoid the connector 96. The mounting of the second heat sink 42 is less limited than that of the fin unit, and the second heat sink 42 can be in the extra space.

In this embodiment, the second heat sink 42 and the heat receiving portion 44 are integrally formed of a metal plate. According to this structure, it is possible to ensure high heat transfer efficiency between the second heat sink 42 and the heat receiving portion 44 and thus accelerate the radiation of heat from the first heat-generating component 51. In addition, since the second heat sink 42 is formed integrally with the heat receiving portion 44, it is possible to reduce the number of components or manufacturing costs.

In this embodiment, the second heat sink 42 is provided on the upstream side of the first heat sink 41. Air from the fan 35 flows through the second heat sink 42 and is then supplied to the first heat sink 41. Therefore, a part of dust included in air adheres to the second heat sink 42 before it reaches the first heat sink 41.

In other wards, the provision of the second heat sink 42 makes it possible to reduce the amount of dust adhering to the first heat sink 41. It is easier to clean the plate-shaped second heat sink 42 than the first heat sink 41, which is a fin unit. Therefore, it is possible to improve the overall cleaning efficiency of an electronic apparatus.

In this embodiment, the second heat sink 42 includes a plurality of projections 86. Therefore, the radiation area of the second heat sink 42 increases and it is possible to further improve heat radiation efficiency. When the projection 86 includes the through hole 87 extending in the direction in which the fan 35 blows air, the flow of cooling air is less likely to be disturbed, and it is possible to further increase the radiation area of the second heat sink 42.

In this embodiment, the projections 86 are arranged in the direction in which the fan 35 blows air. According to this structure, the flow of air from the fan 35 is adjusted by the projections 86 such that air is guided to the first heat sink 41 with little disturbance. Therefore, air is less likely to remain or flow backward in the housing 5, and it is possible to improve heat radiation efficiency.

When the through holes 87 pass through the rear surface (first surface 84) of the second heat sink 42, air can flow between the second heat sink 42 and the circuit board 43 through the through holes 87. That is, the rear surface of the second heat sink 42 is directly exposed to cooling air and the heat radiation efficiency of the second heat sink 42 is further improved.

Since air flows between the second heat sink 42 and the circuit board 43, it is possible to accelerate the cooling of electronic components (for example, the second heat-generating component 52) on the circuit board 43. That is, the arrangement of the second heat sink 42 makes it possible to supply cooling air to components covered with the second heat sink 42.

In this embodiment, the second heat sink 42 is further away from the circuit board 43 than the heat receiving portion 44. In this way, it is possible to further increase the size of the space S between the second heat sink 42 and the circuit board 43 through which air flows. Therefore, it is possible to accelerate the cooling of electronic components on the circuit board 43.

In this embodiment, the second heat sink 42 includes the cut-out portion 95. The cut-out portion 95 passes through the second heat sink 42. The fixing portion 93 of the pressing member 91 is inserted into the cut-out portion. Air from the fan 35 can flow to the space between the second heat sink 42 and the circuit board 43 through the cut-out portion 95. In this way, similarly, it is possible to accelerate the cooling of electronic components on the circuit board 43.

In this embodiment, the electronic apparatus includes the heat receiving portion 44 facing the heat-generating component 51, and the second heat sink 42 including the projections 86, and the heat receiving portion 44 and the second heat sink 42 are integrally formed with each other as the radiating member 81 which is a metal plate. According to the radiating member 81, it is possible to ensure high heat transfer efficiency between the heat receiving portion 44 and the second heat sink 42 and improve the heat radiation efficiency of the second heat sink 42. In addition, when the heat receiving portion 44 is formed integrally with the second heat sink 42, it is possible to reduce manufacturing costs.

(Second Embodiment)

Next, a television 101 according to a second embodiment will be described with reference to FIG. 11. In the second embodiment, components having the same or similar functions as those of the first embodiment are denoted by the same reference numerals and a description thereof will not be repeated. In addition, structures other than the following structures are the same as those in the first embodiment.

As shown in FIG. 11, the television 101 includes a housing 5 and a display panel 22 in the housing 5. The same components as those in the first embodiment are in the housing 5. FIG. 11 shows only some components, but, for example, a circuit board 43, a first heat-generating component 51, a second heat-generating component 52, a fan 35, a first heat sink 41, a second heat sink 42, and a heat receiving portion 44 are provided in the housing 5 substantially in the same structure and with the same arrangement relationship as those in the first embodiment.

According to this structure, similar to the first embodiment, it is possible to improve heat radiation efficiency. In addition, the television 101 may have substantially the same structure as those in the following third and fourth embodiments.

(Third Embodiment)

Next, an electronic apparatus 1 according to a third embodiment will be described with reference to FIG. 12. In the third embodiment, components having the same or similar functions as those of the first embodiment are denoted by the same reference numerals and a description thereof will not be repeated. In addition, structures other than the following structures are the same as those in the first embodiment.

As shown in FIG. 12, a housing 5 includes a heat-generating component 51. A first heat sink 41 faces outlets 38 of the housing 5. The heat-generating component 51 is between first and second heat sinks 41 and 42 and a fan 35. The fan 35 discharges air to the heat-generating component 51. The flow path of air from the fan 35 is straight from the fan 35 to the outlets 38 of the housing 5.

The second heat sink 42 is between the heat-generating component 51 and the first heat sink 41 in the flow path of air from the fan 35. Each of the first heat sink 41 and the second heat sink 42 is, for example, a fin unit. The first heat sink 41 is thermally connected to the heat-generating component 51 by a first heat pipe 45. The second heat sink 42 is thermally connected to the heat-generating component 51 by a second heat pipe 111.

According to this structure, similar to the first embodiment, it is possible to improve heat radiation efficiency.

(Fourth Embodiment)

Next, an electronic apparatus 1 according to a fourth embodiment will be described with reference to FIG. 13. In the fourth embodiment, components having the same or similar functions as those of the first embodiment are denoted by the same reference numerals and a description thereof will not be repeated. In addition, structures other than the following structures are the same as those in the third embodiment.

As shown in FIG. 13, a fan 35 is between a heat-generating component 51 and a second heat sink 42. According to this structure, similar to the first embodiment, it is possible to improve heat radiation efficiency.

The embodiments are not limited to the above-described embodiments, and the components of the above-described embodiments may be changed without departing from the scope and spirit of the embodiment. In addition, a plurality of components according to the above-described embodiments may be appropriately combined with each other to form various structures. For example, some of the components according to the above-described embodiments may be removed. The components according to different embodiments may be appropriately combined with each other.

For example, in the first embodiment and the second embodiment, the second heat sink 42 may be thermally connected to the first heat-generating component 51 by a heat pipe. The heat receiving portion 44 and the second heat sink 42 may not be integrated with each other. For example, the number of projections 86, through holes 87, and cut-out portions 95 of the second heat sink 42, or the shape or structure thereof is not particularly limited. The projections 86, the through holes 87, and the cut-out portions 95 may be appropriately omitted.

The first heat sink 41 may not face the outlets 38 of the housing 5. The first heat sink 41 may not be thermally connected to the first heat-generating component 51 by the heat pipe 45. The first heat sink 41 may be formed integrally with the heat receiving portion 44. The first heat sink 41 may not be a fin unit, but may be formed in, for example, a plate shape.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
   a housing comprising an outlet;
   a heat-generating component in the housing;
   a circuit board comprising a first surface comprising the heat-generating component, a second surface opposite the first surface, and a third surface extending between an edge of the first surface and an edge of the second surface in a direction crossing the first surface;
   a fan which is outside the circuit board and comprises a discharge hole facing the third surface, and which discharges air to flow along the first surface, toward the heat-generating component, and air to flow along the second surface;
   a first heat sink outside the circuit board and facing the third surface, and having a surface facing the outlet;
   a heat transfer member which thermally connects the heat-generating component to the first heat sink; and
   a second heat sink overlapping the circuit board and thermally connected to the heat-generating component, the second heat sink located between the heat-generating component and the first heat sink in a flow direction of the air from the fan such that the air from the fan at least partially flows around the second heat sink after flowing around the heat-generating component and, after flowing around the second heat sink, flows toward the first heat sink.

2. The apparatus of claim 1, wherein the first heat sink receives air flowing along the first surface and air flowing along the second surface.

3. An electronic apparatus comprising:
a housing;
a heat-generating component in the housing;
a circuit board comprising a first surface comprising the heat-generating component, a second surface opposite the first surface, and a third surface extending between an edge of the first surface and an edge of the second surface in a direction crossing the first surface, and
a first radiating portion outside the circuit board and facing the third surface in the housing, the first radiating portion thermally connected to the heat-generating component;
a second radiating portion overlapping the circuit board in the housing, the second radiating portion thermally connected to the heat-generating component; and
a fan which is outside the circuit board and comprises a discharge hole facing the third surface, and which discharges air to flow along the first surface, toward the heat-generating component, and air to flow along the second surface;
wherein the heat-generating component, the second radiating portion and the first radiating portion are arranged in this order in a flow direction of the air from the fan such that the air from the fan at least partially flows around the second radiating portion after flowing around the heat-generating component and, after flowing around the second radiating portion, flows toward the first radiating portion.

4. The apparatus of claim 3,
wherein the first radiating portion receives air flowing along the first surface and air flowing along the second surface.

5. An electronic apparatus comprising:
a housing comprising an outlet;
a heat-generating component in the housing;
a fan which discharges air toward the heat-generating component;
a first heat sink having a surface facing the outlet;
a heat transfer member which thermally connects the heat-generating component to the first heat sink; and
a second heat sink between the heat-generating component and the first heat sink in a flow path of the air from the fan and thermally connected to the heat-generating component, the second heat sink comprising a plurality of projections, at least some of the projections each comprising a hole through which the air can flow.

6. The apparatus of claim 5, further comprising:
a circuit board comprising the heat-generating component,
wherein at least a portion of the second heat sink is disposed over the circuit board.

7. The apparatus of claim 6,
wherein the second heat sink comprises a first surface facing the circuit board and a second surface opposite the first surface, and
the holes pass through the second heat sink from the first surface to the second surface.

8. The apparatus of claim 7, further comprising:
a metal plate comprising the second heat sink and a heat-receiving portion facing the heat-generating component, the metal plate comprising a gap between the second heat sink and the circuit board, through which the air can flow,
wherein the second heat sink is further away from the circuit board than the heat receiving portion.

9. The apparatus of claim 7, further comprising:
a pressing member comprising a first portion facing the heat transfer member and a second portion fixed to the circuit board,
wherein the second heat sink comprises a cut-out portion passing through the second heat sink from the first surface to the second surface, and
the second portion of the pressing member is disposed in the cut-out portion.

* * * * *